(12) United States Patent
Dobashi

(10) Patent No.: US 6,882,183 B2
(45) Date of Patent: Apr. 19, 2005

(54) MULTI-LEVEL OUTPUT CIRCUIT

(75) Inventor: Nagayoshi Dobashi, Atsugi (JP)

(73) Assignee: Mitsumi Electric Co., Ltd., Tama (JP)

( * ) Notice: Subject to any disclaimer, the term of this patent is extended or adjusted under 35 U.S.C. 154(b) by 0 days.

(21) Appl. No.: 10/607,334

(22) Filed: Jun. 26, 2003

(65) Prior Publication Data

US 2004/0056714 A1 Mar. 25, 2004

(30) Foreign Application Priority Data

Sep. 24, 2002 (JP) .................................... 2002-277759

(51) Int. Cl.[7] .................................................. G01R 19/00
(52) U.S. Cl. ........................................ 327/54; 327/562
(58) Field of Search ..................... 327/50, 54, 560–562

(56) References Cited

U.S. PATENT DOCUMENTS

| | | | | |
|---|---|---|---|---|
| 4,417,220 A | * | 11/1983 | Holyman et al. | 333/174 |
| 4,992,758 A | * | 2/1991 | Takeuchi | 330/281 |
| 5,708,376 A | * | 1/1998 | Ikeda | 327/50 |
| 5,949,263 A | * | 9/1999 | Marie | 327/156 |
| 6,429,718 B1 | * | 8/2002 | Lauter et al. | 327/336 |

* cited by examiner

Primary Examiner—Timothy P. Callahan
Assistant Examiner—Cassandra Cox
(74) Attorney, Agent, or Firm—Ladas & Parry LLP

(57) ABSTRACT

In a multi-level output circuit, an amplifier circuit amplifies a constant input voltage and outputs the amplified constant input voltage. The multi-level output circuit is capable of selectively outputting signals of different levels by switching the gain of the amplifier circuit by a switch.

4 Claims, 4 Drawing Sheets

MULTI-LEVEL OUTPUT CIRCUIT

BACKGROUND OF THE INVENTION

1. Field of the Invention

The present invention generally relates to multi-level output circuits, and more particularly, to a multi-level output circuit capable of selectively outputting signals of multiple levels.

2. Description of the Related Art

FIG. 1 is a circuit configuration diagram of an example of conventional three-level output circuits.

A conventional three-level output circuit 1 is constructed by a high-level output circuit 11, a middle-level output circuit 12, and a low-level output circuit 13.

The high-level output circuit 11 includes a reference voltage source 21, an operational amplifier 22, and a switch 23. The reference voltage source 21 generates a reference voltage Vref1. The reference voltage Vref1 generated by the reference voltage source 21 is supplied to a noninverting input terminal of the operational amplifier 22.

The operational amplifier 22 forms a noninverting amplifier circuit. A drive voltage Vcc is supplied to the operational amplifier 22 via the switch 23. The switch 23 is connected to a control terminal Tc1. The switch 23 is turned ON when the voltage of the control terminal Tc1 is at a high level and turned OFF when the voltage of the control terminal Tc1 is at a low level.

The operational amplifier 22 is in an operating state while the switch 23 is turned ON and supplies the reference voltage Vref1 to an output terminal Tout. In addition, the operational amplifier 22 is in a non-operating state while the switch 23 is turned OFF and does not supply the reference voltage Vref1 to the output terminal Tout.

The middle-level output circuit 12 includes a reference voltage source 31, an operational amplifier 32, and a switch 33. The reference voltage source 31 generates a middle-level reference voltage Vref2 that is lower than the reference voltage Vref1. the reference voltage Vref2 generated by the reference voltage source 31 is supplied to a noninverting input terminal of the operational amplifier 32.

The operational amplifier 32 forms a noninverting amplifier circuit. The drive voltage Vcc is supplied to the operational amplifier 32 via the switch 33. The switch 33 is connected to a control terminal Tc2. The switch 33 is turned ON when the voltage of the control terminal Tc2 is at a high level and turned OFF when the voltage of the control terminal Tc2 is at a low level.

The operational amplifier 32 is in an operating state while the switch 33 is turned ON and supplies the reference voltage Vref2 to the output terminal Tout. In addition, the operational amplifier 32 is in a non-operating state while the switch 33 is turned OFF and does not supply the reference voltage Vref2 to the output terminal Tout.

The low-level output circuit 13 is constructed by a resistance R1. The resistance R1 is connected between the output terminal Tout and the ground. When the high-level output circuit 11 and the middle-level output circuit 12 are in the non-operating states, the low-level output circuit 13 connects the output terminal Tout to the ground so that the output terminal Tout is at a low level.

FIG. 2 is a timing diagram for explaining the operation of the example of conventional three-level output circuits. FIG. 2-A indicates the voltage waveform of the control terminal Tc1, FIG. 2-B indicates the voltage waveform of the control terminal Tc2, and FIG. 2-C indicates the voltage waveform of the output terminal Tout.

In a case where, during a term T1 (refer to FIG. 2), the voltage of the control terminal Tc1 is at a high level and the voltage of the control terminal Tc2 is at a low level, the switch 23 is turned ON and the switch 33 is turned OFF. When the switch 23 is turned ON, the drive voltage Vcc is applied to the operational amplifier 22, and the reference voltage Vref1 is supplied to the output terminal Tout. In addition, when the switch 33 is turned OFF, the drive voltage Vcc is not supplied to the operational amplifier 32. Consequently, the operational amplifier 32 takes the non-operating state. Hence, the output voltage Vref1 of the operational amplifier 22 is supplied to the output terminal Tout, and the voltage of the output terminal Tout becomes a high level as indicated by FIG. 2-C.

When, during a term T2 (refer to FIG. 2), the voltage of the control terminal Tc1 is at a low level and the voltage of the control terminal Tc2 is at a high level, the switch 23 is turned OFF and the switch 33 is turned ON. When the switch 23 is turned OFF, the drive voltage Vcc is not supplied to the operational amplifier 22. As a result, the operational amplifier 22 takes the non-operating state. Additionally, when the switch 33 is turned ON, the drive voltage Vcc is applied to the operational amplifier 32. Thus, the operational amplifier 32 takes the operating state. Hence, the output voltage Vref2 of the operational amplifier 32 is supplied to the output terminal Tout, and the voltage of the output terminal Tout becomes a middle level as indicated by FIG. 2-C.

When, during a term T3 (FIG. 2), when the voltages of the control terminals Tc1 and Tc2 are both at low levels, the switches 23 and 33 are both turned OFF. When the switch 23 is turned OFF, the drive voltage Vcc is not applied to the operational amplifier 22. Thus, the operational amplifier 22 takes the non-operating state. In addition, when the switch 33 is turned OFF, the drive voltage Vcc is not supplied to the operational amplifier 32. Consequently, the operational amplifier 32 takes the non-operating state. Hence, neither of the high-level output circuit 11 nor the middle-level output circuit 12 supplies voltage to the output terminal Tout. Accordingly, the output terminal Tout is connected to the ground via the resistance R1. Thus, the output terminal Tout is at a low level as indicated by FIG. 2-C.

As described above, the output level is selectively determined from among the three levels: the high, middle, and low levels.

In the conventional three-level output circuit, however, three circuits, that is, the high-level output circuit 11 for outputting a high level, the middle-level output circuit 12 for outputting a middle level, and the low-level output circuit 13 for outputting a low level, are required. Accordingly, there are problems in that the circuit configuration becomes complicated, for example.

SUMMARY OF THE INVENTION

It is a general object of the present invention to provide an improved and useful multi-level output circuit in which the above-mentioned problems are eliminated.

It is another and more specific object of the present invention to provide a multi-level output circuit capable of simplifying the circuit configuration thereof.

In order to achieve the above-mentioned objects, according to one aspect of the present invention, there is provided a multi-level output circuit that includes:

an amplifier circuit amplifying and outputting a constant input voltage; and a switch switching the gain of the amplifier circuit, wherein the multi-level output circuit is capable of selectively outputting signals of different levels by switching the gain of the amplifier circuit by the switch.

According to the above-mentioned aspect of the present invention, signals of different levels are selectively output by switching the gain of the amplifier circuit by the switch. Thus, it is unnecessary to provide a circuit for each level. Hence, it is possible to realize a multi-level output circuit with a simple construction.

In addition, in the above-described multi-level output circuit, the amplifier circuit may adjust the gain in accordance with a feedback amount, and the feedback amount may be switched in response to switching of the switch. Thus, it is possible to output signals of different levels.

Accordingly, signals of different levels are selectively output by switching the feedback amount of the amplifier circuit by the switch. Thus, it is unnecessary to provide a circuit for each level. Therefore, it is possible to realize a multi-level output circuit with a simple construction.

Further, the amplifier circuit may include: an operational amplifier circuit; a reference voltage source applying a reference voltage to a noninverting input terminal of the operational amplifier circuit; a first resistance connected between an output terminal and an inverting input terminal of the operational amplifier circuit; and a second resistance having one end connected to the inverting input terminal of the operational amplifier circuit, amplify the reference voltage in a noninverting manner at the gain in accordance with the ratio of the first resistance to the second resistance and output the amplified reference voltage, and the switch may include: a first switch connected between the other end of the second resistance and a predetermined voltage; and a second switch that switches supply of a drive voltage to the operational amplifier circuit.

Accordingly, the reference voltage is applied to the noninverting input terminal of the operational amplifier circuit, the first resistance connected between the output terminal and the inverting input terminal of the operational amplifier circuit and the second resistance having one end connected to the inverting input terminal of the operational amplifier circuit are provided, and the feedback amount to the operational amplifier circuit can be switched by the first switch that is connected between the other end of the second resistance and the predetermined voltage (GND). Hence, it is possible to switch the gain and to switch the output between high and middle levels. In addition, the supply of the drive voltage to the operation amplifier circuit can be switched by the second switch that switches the supply of the drive voltage to the operational amplifier circuit. Hence, it is possible to cause the operational amplifier circuit to be in a non-operating state and make the output to be at a low level. As described above, according to the present invention, it is possible to output signals of three levels, that is, high, middle, and low levels.

Additionally, the first and second resistances may set the gain of the amplifier circuit and operate as output resistances.

Accordingly, by using the first and second resistances for setting the gain of the amplifier circuit and causing the first and second resistances to operate as the output resistances, it is possible to control the increase of the number of devices.

According to the present invention, the gain of the amplifier circuit is switched by the switch so as to selectively output signals of different levels. Thus, it is unnecessary to provide a circuit for each level. Accordingly, it is possible to realize a multi-level output circuit with a simple construction.

Other objects, features and advantages of the present invention will become more apparent from the following detailed description when read in conjunction with the following drawings.

DETAILED DESCRIPTION OF THE PREFERRED EMBODIMENTS

A description will now be given of a three-level output circuit as one embodiment of the multi-level output circuit according to the present invention.

Figure 1:
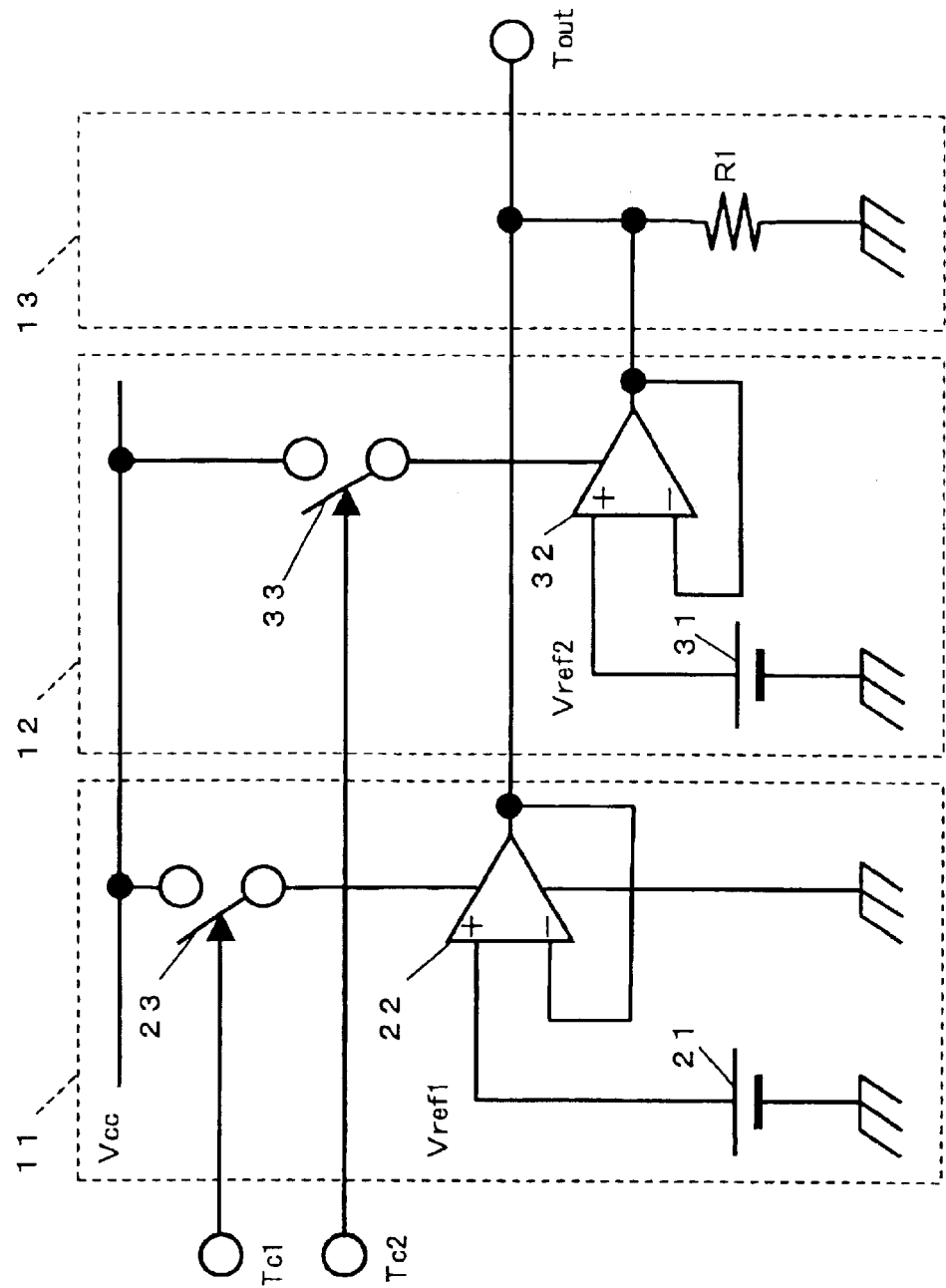
FIG. 1 is a circuit diagram of a conventional example.
Figure 2:
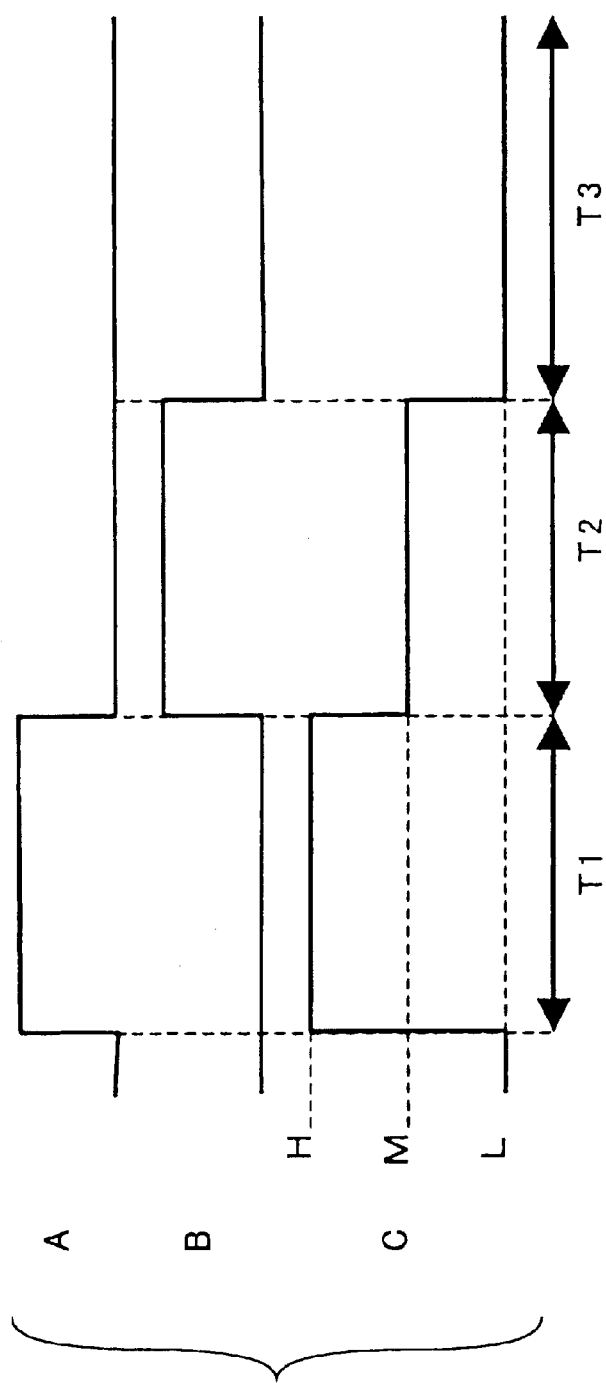
FIG. 2 is a timing diagram for explaining the operation of the conventional example.
Figure 3:
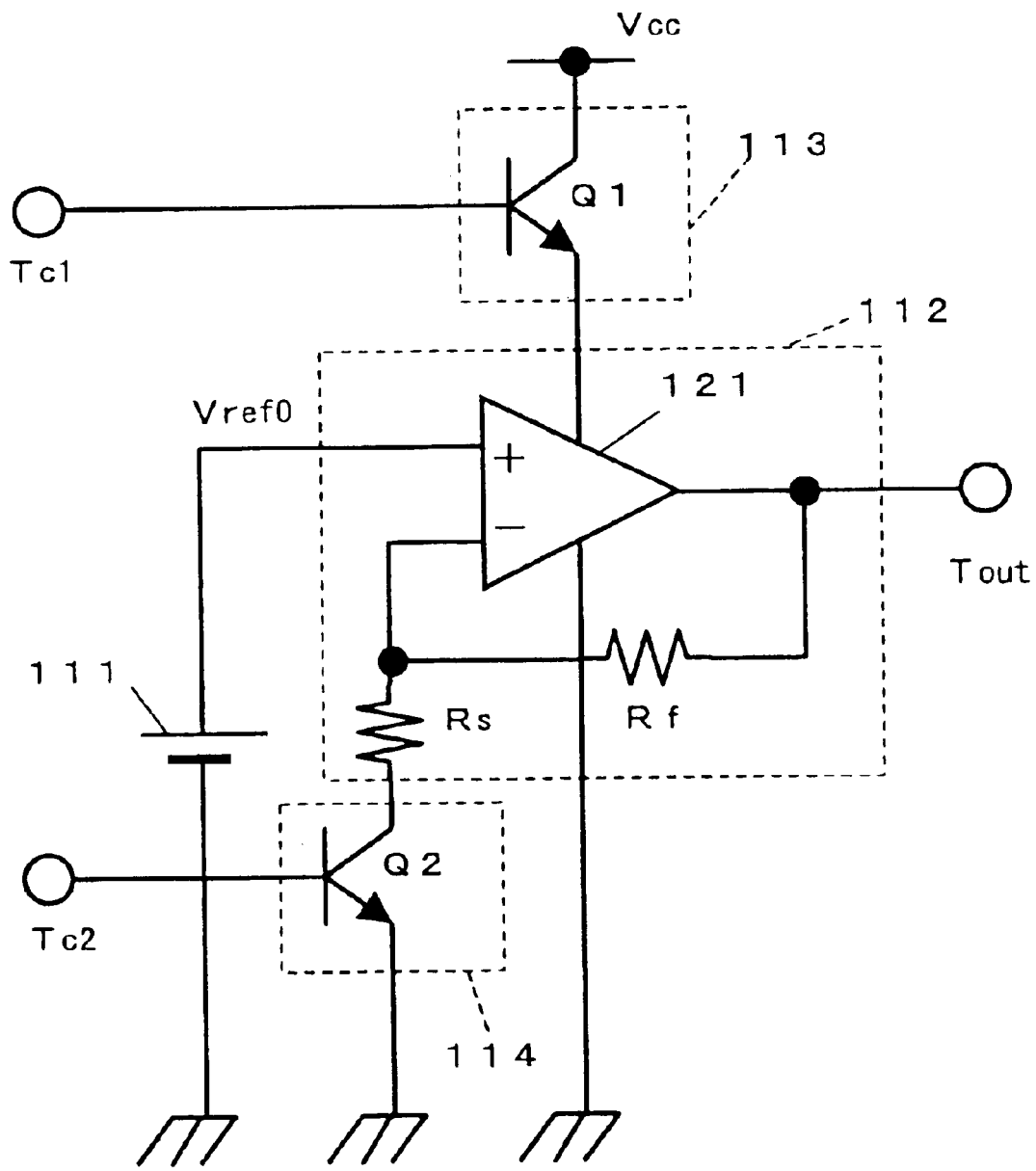
FIG. 3 is a circuit diagram of one embodiment of the present invention.

FIG. 3 shows the circuit configuration of the three-level output circuit according to the embodiment of the present invention.

A three-level output circuit 100 of this embodiment includes a reference voltage source 111, an amplifier circuit 112, and switches 113 and 114 as switch means.

The reference voltage source 111 generates a reference voltage Vref0. The reference voltage Vref0 generated by the reference voltage source 111 is supplied to the amplifier circuit 112.

The amplifier circuit 112 includes an operational amplifier 121 and the resistances Rf and Rs, and forms a noninverting amplifier circuit. The reference voltage Vref0 generated by the reference voltage source 111 is supplied to the noninverting input terminal of the operational amplifier 121. The resistance Rf is a feedback resistance and is connected between the output terminal and the inverting input terminal of the operational amplifier 121. One end of the resistance Rs is connected to the inverting input terminal of the operational amplifier 121, and the other end is connected to the ground via the switch 114. Further, a drive voltage Vcc is supplied to the operational amplifier 121 via the switch 113.

The switch 113 controls switching of the supply of the drive voltage Vcc to the operational amplifier 121. The switch 113 is constructed by, for example, a NPN transistor Q1. The base of the transistor Q1 is connected to the control terminal Tc1. When the control terminal Tc1 is at a high level, the transistor Q1 is turned ON and applies the drive voltage Vcc to the operational amplifier 121. When the control terminal Tc1 is at a low level, the transistor Q1 is turned OFF and stops the supply of the drive voltage Vcc to the operational amplifier 121.

The switch 114 controls switching of connection of the resistance Rs to the ground. The switch 114 is constructed by, for example, an NPN transistor Q2. The base of the transistor Q2 is connected to a control terminal Tc2. When the control terminal Tc2 is at a high level, the transistor Q2 is turned ON and connects the other end of the resistance Rs to the ground. When the control terminal Tc2 is at a low level, the transistor Q2 is turned OFF and causes the other end of the resistance Rs to be open.

The resistances Rf and Rs are set to satisfy, for example:

Rf=Rs.

Accordingly, the gain α of the amplifier circuit 112 is obtained by:

α=(Rf+Rs)/Rs=2Rs/Rs=2.

Hence, the middle level is ½ of the high level. It is possible to freely set the middle and high levels by varying the ratio of the resistance Rf to the resistance Rs.

In addition, the resistances Rf and Rs operate to set the gain α when the amplifier circuit 112 is in the operating state. However, when the low level is output, that is, when the amplifier circuit 112 is in the non-operating state and the switch 114 is in the ON-state, the resistances Rf and Rs are connected between the output terminal Tout and the ground so as to operate as output resistances.

Next, a description will be given of the operation of the three-level output circuit 100 of this embodiment.

Figure 4:
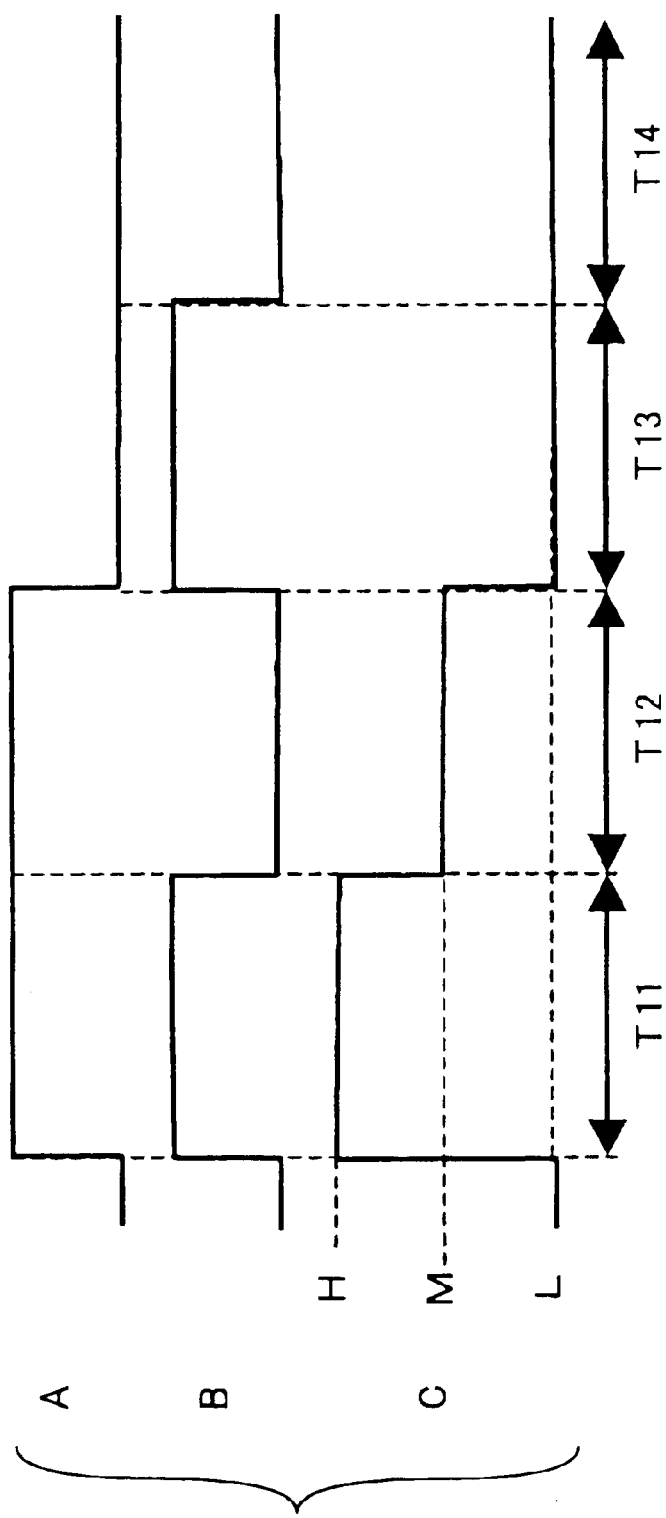
FIG. 4 is a timing diagram for explaining the operation of the embodiment of the present invention.

FIG. 4 is a timing diagram for explaining the operation of the embodiment of the present invention. FIG. 4-A indicates the voltage waveform of the control terminal Tc1, FIG. 4-B indicates the voltage waveform of the control terminal Tc2, and FIG. 4-C indicates the voltage waveform of the output terminal Tout.

In a case where, during a term T11 (refer to FIG. 4), the voltages of the control terminals Tc1 and Tc2 are both at high levels, the switches 113 and 114 are both turned ON. When the switch 113 is turned ON, the drive voltage Vcc is applied to the operational amplifier 121, and the amplifier circuit 112 takes the operating state.

In addition, when the switch 114 is turned ON, the resistance Rs is connected to the ground. Thus, the gain α of the amplifier circuit 112 is doubled. Accordingly, the voltage (2×Vref0) twice the reference voltage Vref0 generated by the reference voltage source 111 is output from the output terminal Tout. Hence, the output level of the output terminal Tout becomes a high level as indicated by FIG. 4-C.

When, during a term T12 (refer to FIG. 4), the voltage of the control terminal Tc1 is at a high level and the voltage of the control terminal Tc2 is at a low level, the switch 113 is turned ON and the switch 114 is turned OFF. When the switch 113 is turned ON, the drive voltage Vcc is applied to the operational amplifier 121, and the amplifier circuit 112 takes the operating state. In addition, when the switch 114 is turned OFF, the other end of the resistance Rs is open. Hence, the gain α of the amplifier circuit 112 is 1. Accordingly, the voltage (Vref0) that is equal to the reference voltage Vref0 generated by the reference voltage source 111 is output from the output terminal Tout. Hence, the output level of the output terminal Tout is at a middle level as indicated by FIG. 4-C.

When, during a term T13 (refer to FIG. 4), the voltage of the control terminal Tc1 is at a low level and the voltage of the control terminal Tc2 is at a high level, the switch 113 is turned OFF and the switch 114 is turned ON. When the switch 113 is turned OFF, the drive voltage Vcc is not applied to the operational amplifier 121. Thus, the amplifier circuit 112 takes the non-operating state. In addition, when the switch 114 is turned ON, the other end of the resistance Rs is connected to the ground. Hence, the output terminal Tout is connected to the ground via the resistances Rf and Rs, and the output terminal Tout becomes the ground level. Accordingly, the output level of the output terminal Tout becomes a low level as indicated by FIG. 4-C.

Further, during a term T14 (refer to FIG. 4), when the voltages of the control terminals Tc1 and Tc2 are both at low levels, the switches 113 and 114 are both turned OFF. When the switch 113 is turned OFF, the drive voltage Vcc is not applied to the operational amplifier 121. Consequently, the amplifier circuit 112 takes the non-operating state. In addition, when the switch 114 is turned OFF, the other end of the resistance Rs is open. Hence, the output terminal Tout is open, and the output impedance of the output terminal Tout takes a high-impedance state.

As described above, according to this embodiment, by selectively outputting signals of different levels through switching the gain (α) of the amplifier circuit 112 by the switches 113 and 114, it is unnecessary to provide a circuit for each level. Accordingly, it is possible to realize the three-level output circuit 100 with a simple construction.

Additionally, at low levels, by causing the operational amplifier 121 to take the non-operating state and to be connected to the ground via the resistances Rf and Rs, the resistances Rf and Rs for setting the gain of the operational amplifier 121 can also be used as the output resistance at low levels. Thus, it is possible to realize the three-level output circuit 100 without increasing the number of unnecessary devices.

Further, by turning OFF both the switches 113 and 114, it is possible to cause the output terminal Tout to take the high-impedance state according to need.

Also, in this embodiment, for ease of explanation, the description is given by taking the three-level output circuit as an example of the multi-level output circuit. However, by varying the numbers of resistances and switches, it is possible to output two levels, or more than three levels.

The present invention is not limited to the specifically disclosed embodiment, and variations and modifications may be made without departing from the scope of the present invention.

The present application is based on Japanese priority application No. 2002-277759 filed on Sep. 24, 2002, the entire contents of which are hereby incorporated by reference.

What is claimed is:

1. A multi-level output circuit, comprising:

an amplifier circuit amplifying and outputting a constant input voltage; and a switch switching a gain of said amplifier circuit, wherein said multi-level output circuit is capable of selectively outputting signals of different levels by switching the gain of said amplifier circuit by said switch, wherein the amplifier circuit adjusts the gain in accordance with a feedback amount, and the feedback amount is switched in response to switching of the switch, wherein the amplifier circuit includes an operational amplifier circuit, a reference voltage source applying a reference voltage to a noninverting input terminal of the operational amplifier circuit, a first resistance connected between an output terminal and an inverting input terminal of the operational amplifier circuit, and a second resistance having one end connected to the inverting input terminal of the operational amplifier circuit, amplifies the reference voltage in a noninverting manner at the gain in accordance with a ratio of the first resistance to the second resistance and outputs the amplified reference voltage, and wherein the switch includes a first switch connected between the other end of the second resistance and a predetermined voltage, and a second switch that switches the supply of a drive voltage to the operational amplifier circuit.

2. The multi-level output circuit as claimed in claim 1, wherein the first and second resistances set the gain of the amplifier circuit and operate as output resistances.

3. A multi-level output circuit, comprising:

an amplifier circuit amplifying and outputting a constant input voltage; and a switch switching a gain of said amplifier circuit, wherein said multi-level output circuit is capable of selectively outputting signals of different levels by switching the gain of said amplifier circuit by said switch, wherein the amplifier circuit includes an operational amplifier circuit, a reference voltage source applying a reference voltage to a noninverting input terminal of the operational amplifier circuit, a first resistance connected between an output terminal and an inverting input terminal of the operational amplifier circuit, and a second resistance having one end connected to the inverting input terminal of the operational amplifier circuit, amplifies the reference voltage in a noninverting manner at the gain in accordance with a ratio of the first resistance to the second resistance and outputs the amplified reference voltage, and wherein the switch includes a first switch connected between the other end of the second resistance and a predetermined voltage, and a second switch that switches the supply of a drive voltage to the operational amplifier circuit.

4. The multi-level output circuit as claimed in claim 3, wherein the first and second resistances set the gain of the amplifier circuit and operate as output resistances.

* * * * *